US009804199B2

(12) United States Patent
Generazio (10) Patent No.: US 9,804,199 B2
(45) Date of Patent: Oct. 31, 2017

(54) EPHEMERAL ELECTRIC POTENTIAL AND ELECTRIC FIELD SENSOR

(71) Applicant: The United States of America as represented by the Administrator of the National Aeronautics and Space Administration, Washington, DC (US)

(72) Inventor: Edward R. Generazio, Yorktown, VA (US)

(73) Assignee: THE UNITED STATES OF AMERICA AS REPRESENTED BY NASA, Washington, DC (US)

( * ) Notice: Subject to any disclaimer, the term of this patent is extended or adjusted under 35 U.S.C. 154(b) by 420 days.

(21) Appl. No.: 14/547,390

(22) Filed: Nov. 19, 2014

(65) Prior Publication Data

US 2015/0137825 A1    May 21, 2015

Related U.S. Application Data

(60) Provisional application No. 61/906,068, filed on Nov. 19, 2013.

(51) Int. Cl.
*G01R 13/02*    (2006.01)
*G01R 29/12*    (2006.01)

(52) U.S. Cl.
CPC ......... *G01R 13/0218* (2013.01); *G01R 29/12* (2013.01)

(58) Field of Classification Search
CPC .................................. G01R 29/12; G01R 5/28
(Continued)

(56) References Cited

U.S. PATENT DOCUMENTS 4,314,251 A    2/1982 Raab
4,894,607 A    1/1990 Kumada
(Continued)

FOREIGN PATENT DOCUMENTS

AU    WO02067015 A1    8/2002
GB           2132357 A    7/1982
(Continued)

OTHER PUBLICATIONS

Ashcroft, Neil W. et al., "Solid State Physics," p. 592, Holt, Rinehart and Winston.
(Continued)

*Primary Examiner* — Tung X Nguyen
*Assistant Examiner* — Robert P Alejnikov, Jr.
(74) *Attorney, Agent, or Firm* — Jonathan B. Soike; Jennifer L. Riley; Mark P. Dvorscak (57) ABSTRACT

Systems, methods, and devices of the various embodiments provide for the minimization of the effects of intrinsic and extrinsic leakage electrical currents enabling true measurements of electric potentials and electric fields. In an embodiment, an ephemeral electric potential and electric field sensor system may have at least one electric field sensor and a rotator coupled to the electric field sensor and be configured to rotate the electric field sensor at a quasi-static frequency. In an embodiment, ephemeral electric potential and electric field measurements may be taken by rotating at least one electric field sensor at a quasi-static frequency, receiving electrical potential measurements from the electric field sensor when the electric field sensor is rotating at the quasi-static frequency, and generating and outputting images based at least in part on the received electrical potential measurements.

18 Claims, 7 Drawing Sheets

(58) Field of Classification Search
USPC ......................................................... 324/547
See application file for complete search history.

(56) References Cited

U.S. PATENT DOCUMENTS

| | | | |
|---|---|---|---|
| 4,931,740 | A | 6/1990 | Hassanzadeh et al. |
| 5,019,804 | A | 5/1991 | Fraden |
| 5,164,673 | A | 11/1992 | Rosener |
| 5,430,381 | A | 7/1995 | Dower |
| 5,986,456 | A | 11/1999 | Yamashita |
| 6,025,726 | A | 2/2000 | Gershenfeld et al. |
| 6,031,378 | A | 2/2000 | Rosin |
| 6,661,115 | B2 | 12/2003 | Lester |
| 6,762,726 | B2 | 7/2004 | Alden et al. |
| 7,119,553 | B2 | 10/2006 | Yang et al. |
| 7,141,987 | B2 | 11/2006 | Hibbs et al. |
| 7,154,275 | B2 | 12/2006 | Zank et al. |
| 7,242,298 | B2 | 7/2007 | Cehelnik |
| 7,295,019 | B2 | 11/2007 | Yang et al. |
| 7,315,173 | B2 | 1/2008 | Funato et al. |
| 7,330,032 | B2 | 2/2008 | Donnangelo |
| 7,471,089 | B2 | 12/2008 | Zerilli et al. |
| 9,279,719 | B2 | 3/2016 | Generazio |
| 9,559,616 | B2 | 1/2017 | Generazio |
| 2005/0242809 | A1* | 11/2005 | McKendry ............. G01G 9/005 324/308 |
| 2006/0071669 | A1 | 4/2006 | Funato et al. |
| 2006/0164094 | A1 | 7/2006 | Golder et al. |
| 2007/0040545 | A1 | 2/2007 | Takiguchi |
| 2008/0246485 | A1 | 10/2008 | Hibbs et al. |
| 2008/0303530 | A1 | 12/2008 | Coutsomitros et al. |
| 2009/0001974 | A1* | 1/2009 | Sheiretov ................ G01L 1/125 324/209 |
| 2009/0284405 | A1 | 11/2009 | Salmon et al. |
| 2009/0295366 | A1 | 12/2009 | Cehelnik |
| 2009/0295644 | A1 | 12/2009 | Curran et al. |
| 2009/0309604 | A1 | 12/2009 | Zhang |
| 2010/0250140 | A1 | 9/2010 | Constable et al. |
| 2010/0259272 | A1 | 10/2010 | Care |
| 2010/0271291 | A1 | 10/2010 | Care |
| 2011/0062968 | A1* | 3/2011 | Renno .................... G01R 29/12 324/654 |
| 2012/0013354 | A1 | 1/2012 | Bowler |
| 2012/0092019 | A1 | 4/2012 | Blum |
| 2012/0199755 | A1* | 8/2012 | Generazio ................ G01J 1/42 250/395 |
| 2012/0259572 | A1* | 10/2012 | Afzal ................... G01C 21/165 702/92 |
| 2013/0063894 | A1* | 3/2013 | Wang ................... H05K 7/1492 361/692 |
| 2013/0088245 | A1* | 4/2013 | Sezginer ................. G03F 1/84 324/679 |

FOREIGN PATENT DOCUMENTS

| | | |
|---|---|---|
| WO | WO03081265 A1 | 10/2003 |
| WO | WO2008152588 A2 | 12/2008 |

OTHER PUBLICATIONS

Horowitz, P. et al., "The Art of Electronics," 1989, 2nd Ed., p. 136, Cambridge University Press.

Generazio, Edward R. et al., "Free-Carrier Absorption in a Quantizing Magnetic Fields," Physical Review B, Dec. 15, 1979, vol. 20, No. 12.

Alpha Lab Inc. (Oct. 28, 2016). Retrieved Oct. 2016, 2016. from Alpha Lab Inc: https://www.trifield.com/content/tribo-electric-series/.

Generazio E.R., "Electric Potential and Electric Field Imaging with Applications. Materials Evaluation," Nov. 1, 2015, pp. 1479-1489, 73(11).

Jackson, J. D., "Classical Electrodynamics," 1999, (3rd ed.), Chapters 4 and 9, Wiley & Sons, New York, NY.

* cited by examiner

EPHEMERAL ELECTRIC POTENTIAL AND ELECTRIC FIELD SENSOR

CROSS REFERENCE TO RELATED APPLICATIONS

This application claims the benefit of priority to U.S. Provisional Application No. 61/906,068 filed on Nov. 19, 2013 entitled "Ephemeral Electric Potential and Electric Field Sensor", the entire contents of which are hereby incorporated by reference in their entirety.

STATEMENT REGARDING FEDERALLY SPONSORED RESEARCH OR DEVELOPMENT

The invention described herein was made by an employee of the United States Government and may be manufactured and used by or for the Government of the United States of America for governmental purposes without the payment of any royalties thereon or therefore.

BACKGROUND OF THE INVENTION

The present invention relates to sensors, and more particularly to sensors for measurements of electric potentials and electric fields.

With an electric field sensor it may be possible to measure the true quantitative electric potential and electrostatic field emanating from, passing through, and present around objects or in free space. A quasi-static measurement process for imaging electric potentials and electric fields has been developed using a quasi-static electric field generator. The quasi-static electric field generator allows for the simultaneous calibration and measurement of the electric field sensor responses in the presence of parasitic intrinsic and extrinsic leakage electrical currents that exist in electrical components. These leakage currents manifest themselves as parasitic capacitances, resistances, and inductances throughout solid state elements of electrical components and the supporting structures. The active constitutive electronic materials of the electronic component, as well as mounting structures, all have these manifestations to some degree. Additionally, the leakage currents are not only supported by solid structures. Leakage currents may also exist in surrounding gases, liquids, and plasmas. When measuring true static electric potentials and electric fields emanating from an object, the measurement process is made more complex by the leakage of charged carriers moving and polarization, due to the presence of the electric field, toward establishing an equilibrium state of the measurement system. This equilibrium process is time dependant and prohibits the measurement of the original true electrical potential and electric field in current systems.

BRIEF SUMMARY OF THE INVENTION

The systems, methods, and devices of the various embodiments provide for the minimization of the effects of intrinsic and extrinsic leakage electrical currents enabling true measurements of electric potentials and electric fields. In an embodiment, an ephemeral electric potential and electric field sensor system may comprise at least one electric field sensor and a rotator coupled to the electric field sensor and configured to rotate the electric field sensor at a quasi-static frequency. In an embodiment, ephemeral electric potential and electric field measurements may be taken by rotating at least one electric field sensor at a quasi-static frequency, receiving electrical potential measurements from the electric field sensor when the electric field sensor is rotating at the quasi-static frequency, and generating and outputting images based at least in part on the received electrical potential measurements.

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

The accompanying drawings, which are incorporated herein and constitute part of this specification, illustrate embodiments of the invention, and together with the general description given above and the detailed description given below, serve to explain various features of the invention.

DETAILED DESCRIPTION OF THE INVENTION

For purposes of description herein, it is to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The word "exemplary" is used herein to mean "serving as an example, instance, or illustration," Any implementation described herein as "exemplary" is not to be construed as preferred or advantageous over other implementations.

The various embodiments will be described in detail with reference to the accompanying drawings. Wherever possible, the same reference numbers will be used throughout the drawings to refer to the same or like parts. References made to particular examples and implementations are for illustrative purposes of and are not intended to limit the scope of the invention or the claims.

Figure 7:
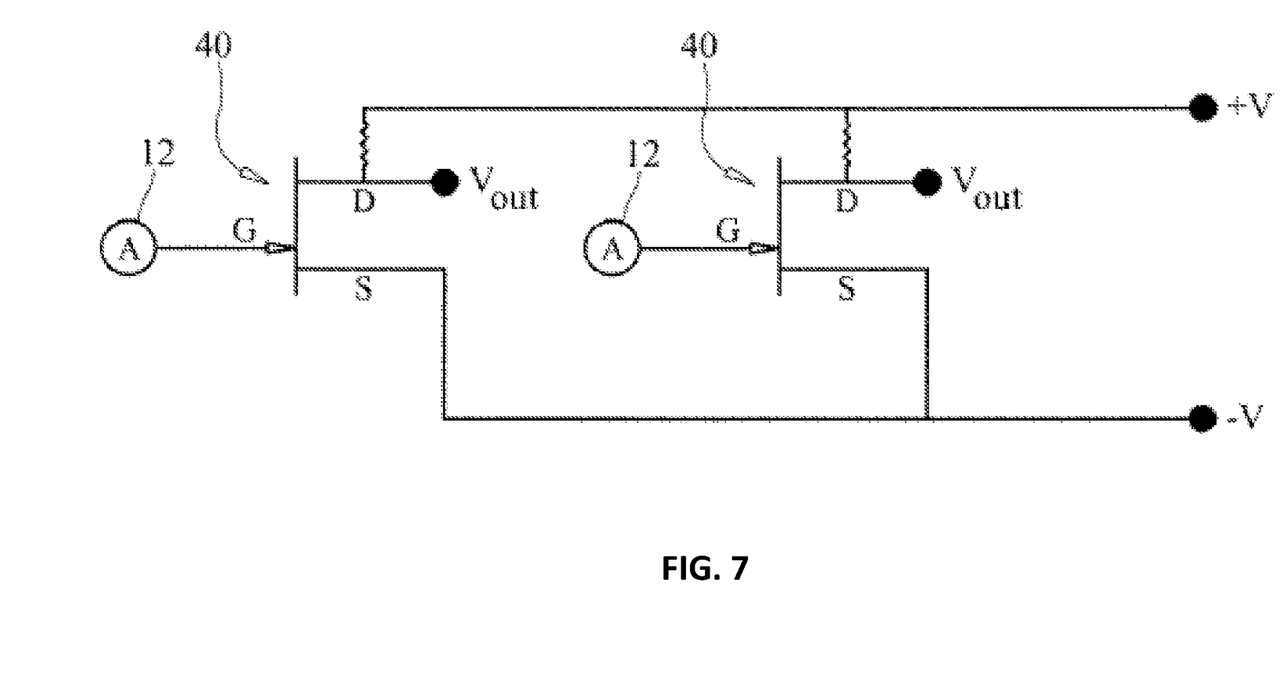
FIG. 7 shows an example circuit having FETs in a floating gate configuration.

Identical electrical components are not exactly identical as evidenced by the wide ranges of specified nominal parameters. A field effect transistor ("FET") based electric field sensor, as described in U.S. Ser. No. 13/020,025 entitled "Electric Field Quantitative Measurement System and Method," filed Feb. 4, 2011 (referred to herein as "the '025 application" and herein incorporated by reference in its entirety), may use a non-specified FET configuration. That is, the FET based electric field sensor uses a floating gate configuration which is contrary to all proper circuit designs. An example circuit from '025 application having FETs in a floating gate configuration is reproduced herein as FIG. 7. In this example, the gates of the FETs 40 are connected to respective antennas 12 for sensing electric fields. For additional detail regarding operation of the circuit, reference may be made to FIG. 4, and the description thereof, in the '025 application. Acceptable designs require a properly supported, but small, electrical current to exist in the gate in order for the FET to function per manufacturer specifications. FETs use three electronic configurations: common source, common drain, and common gate. FETs may be calibrated for common source and common drain configurations where the gate is physically connected to a voltage source. In the common gate configuration the gate is physically connected to ground. In all configurations, the electrical connections to the gate are at an electrical potential that is a direct physical electrical path for charged carriers. The electric field sensor does not provide the required physical connection for specified gate current.

However, a problem may arise where the electronic configuration is not a common source, common drain, or common gate configuration, as described in the '025 application. There are two aspects to this calibration, first, the gain of the electric field sensor, and second, the time response of the electric field sensor to presence static and quasi-static electric fields. The quasi-static electric field generator described in U.S. Ser. No. 13/800,379 entitled "Quasi-Static Electric Field Generator," filed Apr. 24, 2012 (referred to herein as "the '379 application" and herein incorporated by reference in its entirety) is designed to provide a controlled source or reference quasi-static electric field (for "illumination of objects and volumes") to minimize the effects of sensor and support structure parasitic leakage currents such that the calibration of gain of the electric field sensor in a quasi-static electric field is straightforward and a linear calibration function is often adequate for all quasi-static frequencies.

Quasi-static frequency range is defined in the "the '379 application, where an external field generator is used. A companion definition of quasi-static is provided for use herein, As used herein, the quasi-static frequency range may be defined as the range where the electric field is present at the gate electrode of the FET for a sufficiently long enough time for the electric field sensor response to reach a steady state for potential measurement, but not long enough for intrinsic and extrinsic leakage or oscillating currents to dominate the measurement of the true static potential. In the various embodiments, rotation of the electric field sensor reverses the effects due to leakage currents, so that another measurement of electric potential may be subsequently made. In the various embodiments, rotation of the sensor may be at low enough frequencies such that the electric field sensor, itself, does not radiate or propagate electromagnetic energy due to oscillating intrinsic and extrinsic leakage or currents, in the quasi-static frequency range as defined herein, an accurate metric measurement of the true static potentials may be made from which the true static electric field is obtained.

The systems, methods, and devices of the various embodiments may provide for the minimization of the effects of leakage intrinsic and extrinsic electrical currents enabling true measurements of electric potentials and electric fields. The various embodiments may provide a method for minimizing the effects of leakage intrinsic and extrinsic electrical currents so that true measurement of electric potentials and electric fields may be made. Various embodiments may use a quasi-static electric field generator to aide in the measurements of electrical potential and electric fields. In various embodiments, measurements of the true electric potential and electric fields may be made by quasi-statically reversing the effects of the parasitic leakage currents of the electric field sensor and supporting structures. In various embodiments, the quasi-static roles of the sensor and the electric field source may be reversed, thereby minimizing parasitic effects. This may be done by physically rotating or moving the electric field sensor, in the presence of a charged object, in such a way that the electric field sensor accurately measures electric potential only for a moment in time or ephemerally. In an embodiment, the sensor movement may be repeated, to make multiple measurements of electric potential, in the quasi-static measurement frequency range. The various embodiments may also have direct application to electrodynamic measurement frequencies where the intrinsic electrodynamic radiation propagating from the electric field sensor in the presence of an electrostatic and/or electrodynamic field, needs to be included in the quantitative electrical potential and electric field measurements.

Figure 1:
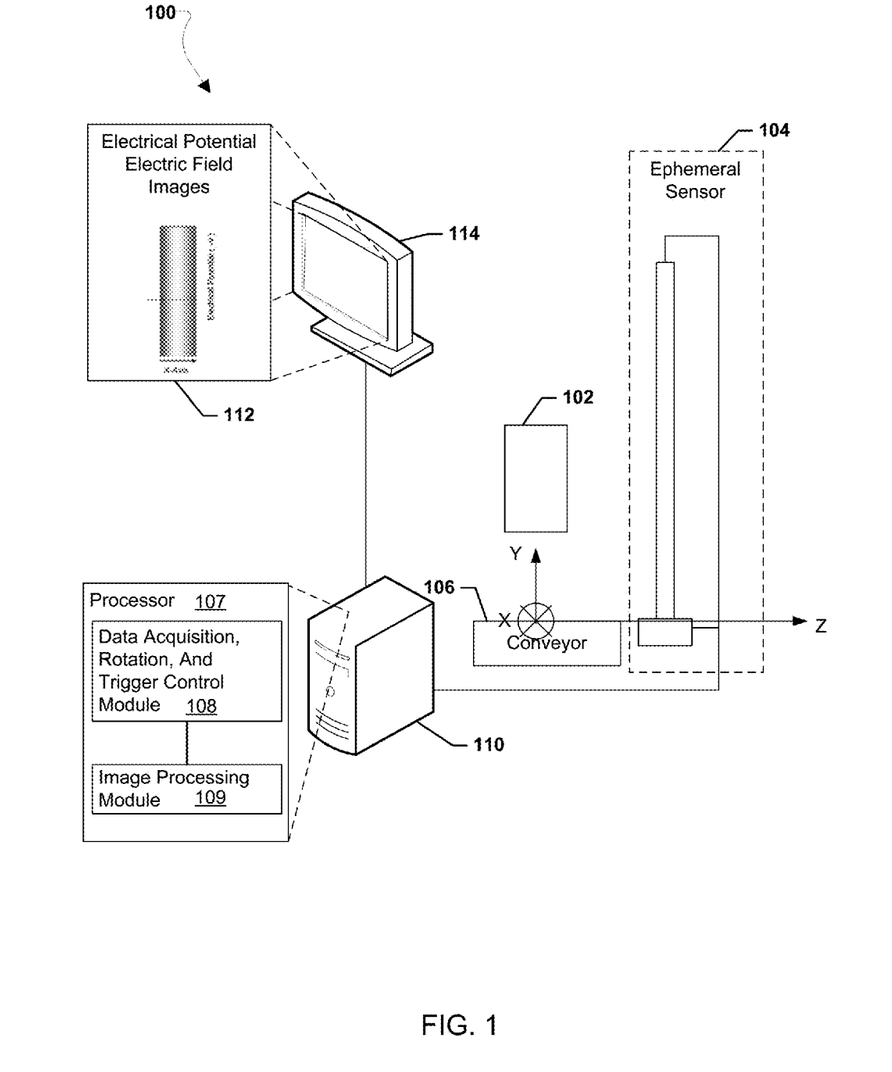
FIG. 1 illustrates an embodiment system for detecting and displaying the electric potential and electric field images of a charged object.

FIG. 1 illustrates an embodiment system 100 for detecting and displaying the electric potential and electric field images of a charged object 102. In an embodiment, the ephemeral electric potential and electric field sensor system 100 may comprise at least one electric field sensor, such as electric field sensor 202 described below with reference to FIG. 2, and a rotator, such as the combination of rotation stage 208, shaft 204, and shaft to rotation stage adaptor 210 described below with reference to FIG. 2, coupled to the electric field sensor and configured to rotate the electric field sensor at a quasi-static frequency.

As illustrated in FIG. 1, in an embodiment, a charged object 102 may be moved past an ephemeral sensor 104 via a conveyor 106, The ephemeral sensor 104 may be connected to a processor 107 of a computer 110, such as by one or more wire (e.g., stage control, power control, trigger control, and/or measurement cables). The ephemeral sensor 104 and the processor 107 of the computer 110 may send/receive electrical signals with one another including stage, power, and trigger control signals sent to the ephemeral sensor 104 from the computer 110 and/or measurement signals sent from the ephemeral sensor 104 to the computer 110. The processor 107 of the computer may have various modules running on it, including a data acquisition, rotation, and trigger control module 108 and/or an image processing module 109. The electric potential as a function of three spatial coordinates, x, y, and z, and time may be recorded by the data acquisition, rotation, and trigger control module 108 running on the processor 107 of the computer 110 in response to the measurement signals received from the ephemeral sensor 104. The measured data may be processed by the image processing module 109 to generate images 112 of electric potential, electric field spatial vector components (Ex, Ey, and Ez), electric field vector, and electric field magnitude (similar to those described in the '025 application) for output on a display 114 connected to the processor 107 of the computer 110. In an embodiment, processor 107 and/or one or more of the modules 108 and/or 109 may be part of a dedicated circuit board. For example, the data acquisition, rotation, and trigger control module 108 may be a dedicated circuit board coupled to the processor 107 and the ephemeral electric field sensor 104 and configured with various pieces of hardware to provide the functionality of the data acquisition, rotation, and trigger control module 108 described herein.

Figures 2, 2A:
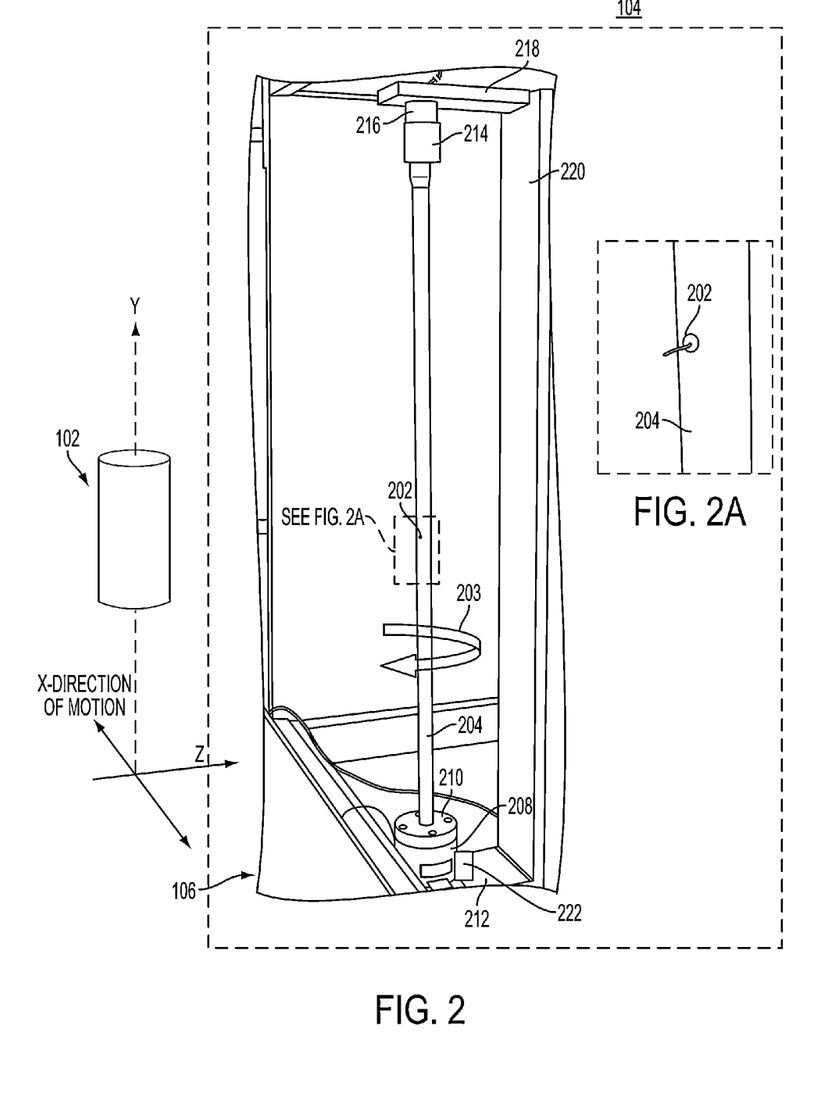
FIG. 2 illustrates an embodiment ephemeral electric field sensor.
FIG. 2A is an enlarged view of a portion of the ephemeral electric field sensor illustrated in FIG. 2.

Details of an ephemeral electric field sensor 104 are shown in FIGS. 2 and 2A. As illustrated in FIG. 2, in an embodiment, a single electric field sensor 202, such as the electric field sensor described in the '025 application, may be mounted to the ephemeral sensor support shaft 204 of the ephemeral electric field sensor 104. FIG. 2A is an enlarged view of a portion of the ephemeral electric field sensor 104 showing one embodiment relationship between the electric field sensor 202 and the shaft 204. In an embodiment, the electric field sensor 202 may be a FET in a floating gate electronic configuration. As illustrated in FIG. 2, the electric field sensor 202 may be mounted on axis of rotation 203 or off axis of rotation (not shown). In an embodiment, the ephemeral support shaft 204 may be rotated by a computer controlled rotation stage 208 via the shaft to rotation stage adapter 210. For example, the rotation stage 208 may be controlled by the processor 107 of the computer 110. In an embodiment, the rotation stage 208 of the ephemeral electric field sensor 104 may be mounted to the lower shaft support bracket 212. In this embodiment, the ephemeral sensor support shaft 204 may also serve as a conduit for the electrical cables for the sensor's power source and sensor measurement voltage. The cables may be passed through the shaft to contact adapter 214 and electrically connected to a rotating noiseless multi-pole electric contact 216 that may be mounted on the upper shaft support bracket 218 that may be connected to the shaft support bracket 220 that may be connected to the lower shaft support bracket 212. The power cables may be connected to the power source and the sensor measurement and trigger cables may be connected to the computer 110 to provide measurements to the data acquisition, rotation, and trigger control module 108. In an embodiment, the ephemeral electric field sensor 104 may include, adjacent to the rotation stage 208, an ephemeral sensor trigger control 222.

Figure 3:
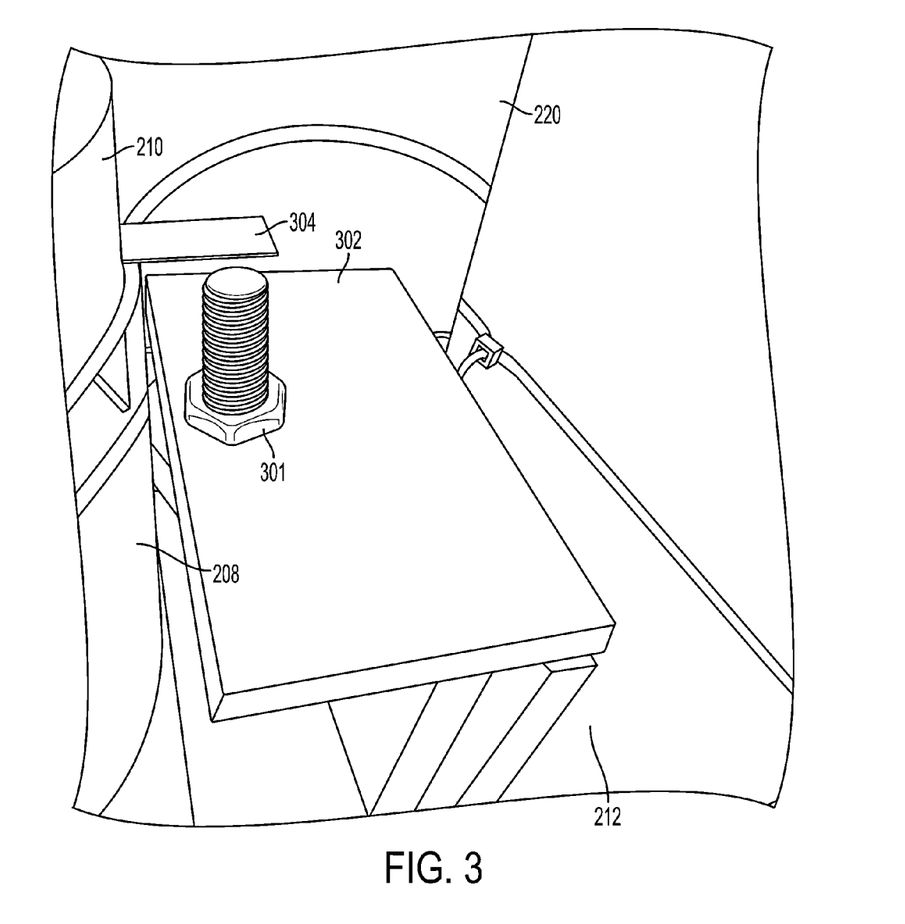
FIG. 3 illustrates an ephemeral sensor trigger control according to an embodiment.

FIG. 3 illustrates an embodiment ephemeral sensor trigger control 222. The ephemeral sensor trigger control 222 may include a trigger sensor 301, which may be supported by a trigger sensor holder 302. The trigger sensor 301 may be excited every time the trigger sensor control tab 304 passes over the trigger sensor 301. The trigger sensor control tab 304 may be mounted at the shaft to rotation stage adapter 210. The trigger signal may be sent from the trigger sensor 301 to the data acquisition, rotation, and trigger control module 108 and identifies the rotational orientation of the sensor 202.

In an embodiment, all brackets are tribo-electrically neutral, low electric susceptibility, and non-conducting. In this manner, the brackets may minimize sensor distortions of the true electric field due to charging, dielectric polarization, and free carrier polarization, respectively. In an embodiment, battery powered elements may be used as well as fiber optic and wireless data acquisition components. In further embodiments, the number of sensors 202 may be increased to more than one to create linear arrays of sensors 202, spiral arrays of sensors 202, or any other array configuration of sensor 202 arrays. For example, a 2-D) array of sensors may be created. In further embodiments, multiple triggers and schemes may be used including electronically indexed stages and optical triggers, in various embodiments, the triggering may not necessarily be singular, and continuous measurements may be made throughout the movement of the ephemeral sensor 104. In various embodiments, the sensor 202 does not necessarily have to be rotated 360 degrees and partial angle cycles may be used. In further embodiments, the ephemeral sensor 202 may be rotated in more than one axis of rotation and/or moved along more than one linear axis simultaneously. In another embodiment, a simultaneous combination of rotations and linear movements of the sensor 202 may be used.

In an embodiment, the movement of the sensor 202 need not be computer controlled. In an embodiment, the ephemeral sensor 104 may be miniaturized to be hand held, for example to be smaller than a deck of playing cards and the operator of the ephemeral sensor 104 may impart the motion necessary to move the sensor 202.

Once the electric field sensor 202 is rotating at quasi-static frequencies, the electric field sensor 202 and its movement may define the elements within the dashed outlined in FIG. 1 to be an ephemeral electric potential and electric field sensor 104.

Figure 4A:
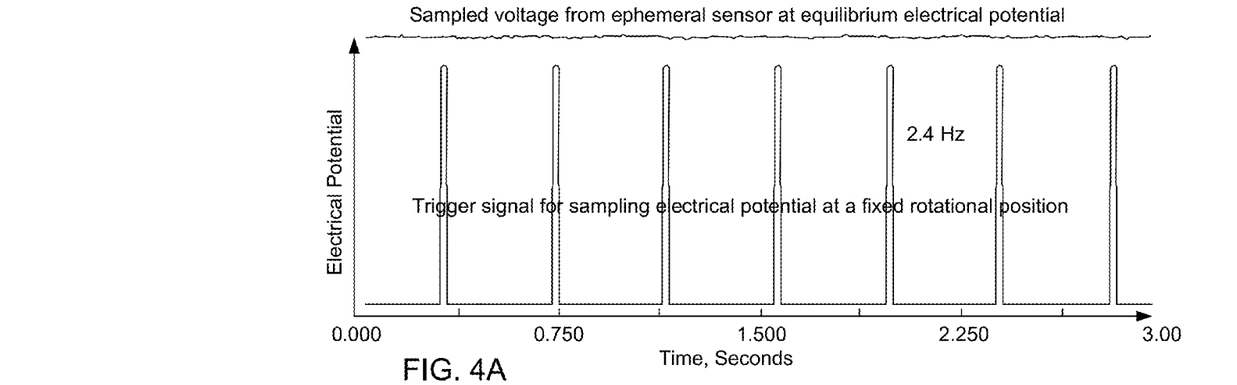
FIG. 4A is a graph of electrical potential versus time illustrating a trigger signal and sampled voltage from an ephemeral sensor at equilibrium electrical potential.
Figure 4B:
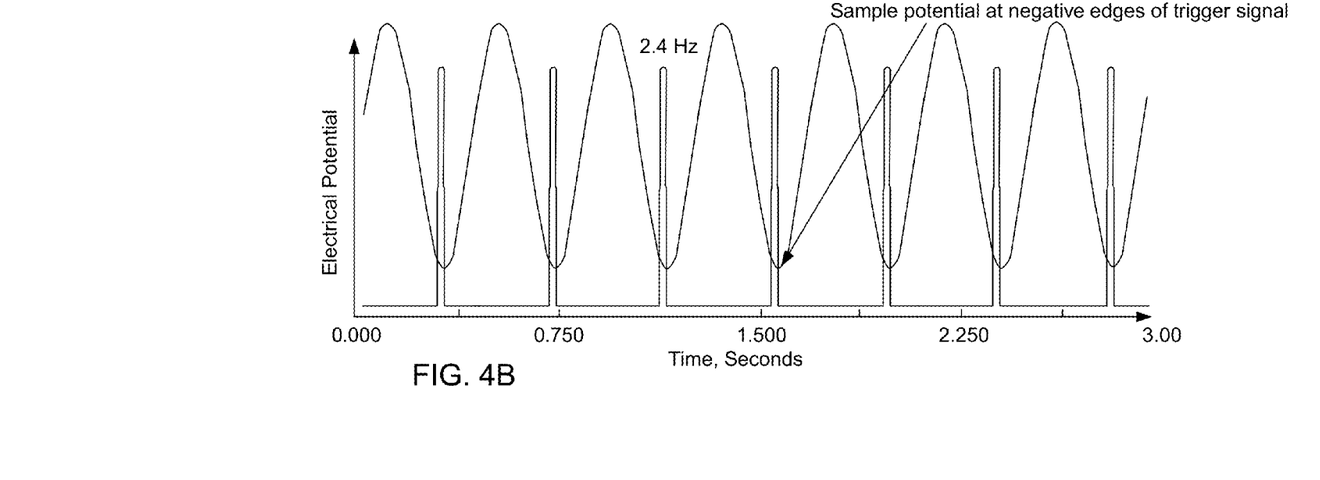
FIG. 4B is a graph of electrical potential versus time illustrating a trigger signal and sampled potential at negative edges of the trigger signal.

FIG. 4A-4B shows typical data observed for when the ephemeral sensor rotation rate is 2.4 Hz. FIG. 4A shows a relatively constant electrical potential as a function of time as measured by the ephemeral sensor 104 when no charged object is present near the ephemeral sensor 104, The trigger signal is also shown as a series of pulses equally spaced in time. FIG. 4B shows the electrical potential as a function of time as measured by the ephemeral sensor 104 when a charged but non-moving object 102 is present on the conveyor 106 near the ephemeral sensor 104. The trigger signal is also shown. As may be seen in FIG. 4B, the measured electric potential oscillates from the equilibrium electrical potential to a minimum and repeats for every rotation. In this particular embodiment, an electric potential minimum refers to a large magnitude negative potential. Each rotation of the sensor 202 may force the parasitic leakage currents flowing previously in the first half of the rotation cycle to relax and reverse, bringing the sensor 102 momentarily back to an equilibrium state. If the rotation is stopped at any point in the rotation, the measurement voltage may return to the equilibrium state. The rate of return to equilibrium may be dependent on the intrinsic parasitic resistances, capacitances, and inductances of the individual electric field sensor 202 and its supporting structure.

In an embodiment, the electric potential measurements may be indexed or scheduled to occur when the trigger 301 places the sensor 202 at the same rotational orientation. FIG. 4B illustrates measurements made at the negative edge of the trigger signal. Other triggering approaches may be used with the various embodiments, and triggering approaches may be selected depending on the application. For the data shown in FIG. 4B, the potential minima occur at a constant value, indicating that the electric potential is a constant in time as observed from a fixed charged object 102.

When imaging charged objects 102 with the ephemeral sensor 104, either the charged object 102 or the entire ephemeral sensor 104 may be moved in specified directions. An imaging example is instructive. A cylindrically symmetric charged object 102 may be moved at a constant velocity along the x-axis, Simultaneously, the ephemeral sensor 104 may be rotating at 2.4 Hz during the movement of the object and the measured electric potential may be captured at each negative edge of the trigger signal.

Figure 5A:
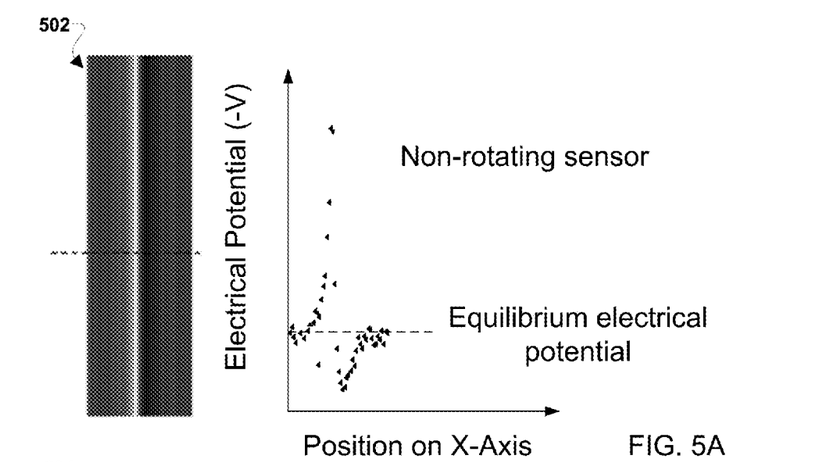
FIG. 5A is a graph of the response of a non-rotating electric field sensor as a function of the x-axis position and a displayed image of the response.

FIG. 5A shows the response of a non-rotating electric field sensor as a function of the x-axis position of the charged object 102 in this example. When the object 102 is far from the sensor 104, the sensor 104 measures the equilibrium electric potential. As the charged object 102 moves in the positive x-direction, the sensor 104 measures a large negative potential followed by a rapid decrease in electric potential magnitude as the object 102 continues past the sensor 104. As the object 102 moves further away from the sensor 104, the sensor 104 measures the equilibrium electric potential. A simulated two dimensional image 502 of the electric potential from a cylindrically symmetric charged object 102 may be constructed for visualization. The image simulation 502 from the real data shown in FIG. 5A is provided as this image provides insight into how raw data may be visualized. The object 102 is cylindrically symmetric and uniformly charged, so the electric potential observed is expected to be symmetric about the axis of symmetry. The two dimensional image 502 in FIG. 5A shows a bright vertical line representing large negative potentials, and just to the right of that bright line there is a darkening that appears to be similar to a shadow. This shadow is the sharp decrease in the electric potential magnitude after the charge object 102 has passed the sensor 104. This shadowing is not present when using the quasi-static electric field generator (the '370 application) with the electric field sensor 104. For the non-rotating configuration, the electric potential is not measured to be cylindrically symmetric and this represents a gross measurement error. When presented with responses similar to that shown in FIG. 5A, one might erroneously accept that the response observed is a quantitative metric of the electric potential from an object, such as a subterranean individual explosive device ("IED"), personnel, a flying aircraft, etc. However, the response shown in FIG. 5A is a signature of electric potential and a signature is not a quantitative metric measurement of electric potential. The quantitative metric measurement of electric potential is required to determine true electrostatic field.

Figure 5B:
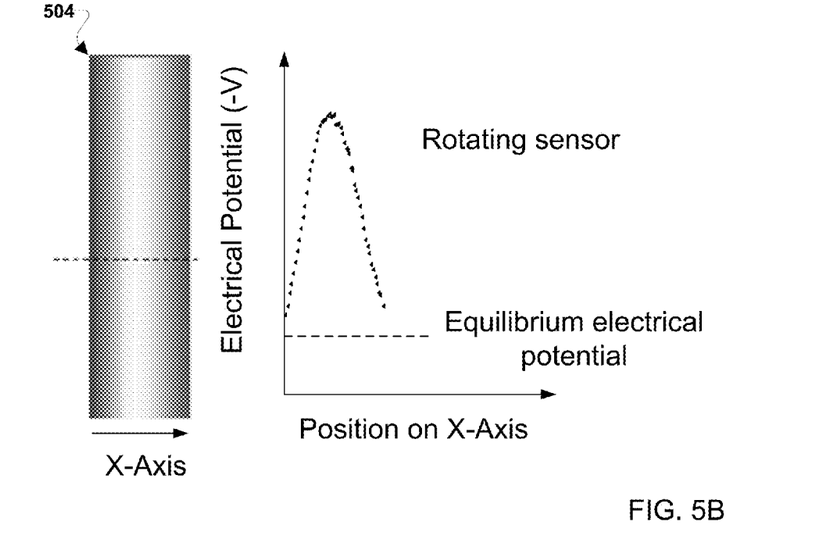
FIG. 5B is a graph of the response from a rotating electric field sensor (ephemeral sensor) as a function of the x-axis position and a displayed image of the response.

FIG. 5B shows the response from a rotating electric field sensor 104 as a function of the x-axis position of the charged object 102. Even when the charged object 102 is far from the ephemeral sensor, the sensor still measures an electric potential that is different from the equilibrium potential. This sensitivity has been further explored to reveal that the ephemeral sensor 104 has a sensitivity range that extends to several feet as a minimum. The charged object 102 had to be removed from the laboratory room before the electric field sensor 104 measured an equilibrium potential value 502. As the charged object 102 moves in the positive x-direction, the sensor 104 measures a large negative potential followed by a uniform and symmetric decrease in electric potential magnitude as the object 102 continues past the ephemeral sensor 104. A simulated two dimensional image 504 of the electric potential from a cylindrically symmetric charged object 102 may be constructed for visualization. The image simulation 504 from the real data shown in FIG. 5B is provided. This image 504 provides validation of the expected symmetry of electric potential. The true electric potential measured by the ephemeral sensor 104 is symmetric about the axis of symmetry, and with the removal of the effects due to leakage currents, the calibration of gain of the ephemeral sensor 104 is straight forward and a linear calibration function is often adequate.

Images of electric potential, electric field spatial vector components (Ex, Ey, and Ez), electric field vector, and electric field magnitude may be generated from the measured data, for example in the manner described in the '025 application. The images generated with the various embodiments described herein may look similar to those described in the '370 application, specifically those illustrated in the 170 application's FIGS. 9 and 11.

The use of a rotating FET while in a floating gate electronic configuration as an electric field sensor to reverse intrinsic leakage currents cancelling the effect of parasitic resistances, capacitances, and inductances in an electronic component and the supporting structure, thereby allowing the measurements of true electric potentials of charged objects at great distances may provide a new imaging technology for electrical potentials. The list of commercial applications may be extensive and includes military and civilian applications. Since every object becomes charged or virtually charged with movement, the various embodiments enable interrogation of personnel, luggage, and containers with or without an external reference electric field. The definition of container may be extended to buildings or facility rooms. The various embodiments may be used to detect and inspect personnel, baggage, wire insulation, hidden objects, subterranean variations, material properties, materials, material damage, material age, material integrity, structural variations, etc. Inspection capabilities provided by the various embodiments include inspection and characterization of liquid, solid, emulsion, foam, insulating, semi-conducting, conducting, metallic, non-metallic, polymer, ceramic, composite, etc., materials and complex structures and their substructures. Security detection of hidden solid metallic systems, such as metallic guns, and nonmetallic polymer and ceramic weapons and explosives may be enabled by the various embodiments. Applications of the various embodiments also include product quality control and intruder detection. Larger and smaller versions of the various embodiment ephemeral sensors are envisioned to be applicable to a wide variety if inspection and monitoring needs.

Further, the atmosphere is rich with charged carriers, and interrogation of the electronic properties of weather atmospheric disturbances is enabled by the various embodiments. Current systems for measuring weather electronic properties are limited to listing lightning strikes that have occurred (past tense). The various embodiments may enable the prediction of the location, strength, and timing of pending lightning strikes. Since the ephemeral sensor has extreme long range sensitivity, there are also direct application to location and timing prediction of pending lightning strikes for terrain, aircraft, and launch operations.

Further, the operation of the human body is based electrochemical processes. Preliminary results indicate that the electric field sensor described in the '025 application may be able to image major body components, e.g., lungs. The various embodiments described herein enable imaging the intrinsic human electric fields without requiring a quasi-static electric field generator. Applications to medical applications may include imaging cardiac electronic properties, lung function, blood conductivity, neural activity, etc. The human body images generated with various embodiments described herein may look similar to those described in the '370 application, specifically those illustrated in the '370 application's FIG. 9.

The various embodiments may also be applicable to electric field 3-D tomography imaging, to include tomography of objects as well a tomographic mapping of environments. The various embodiments also may enable 2D tomographic mapping of environments.

The various embodiments may also be applicable to earthquake prediction. This invention may also have applications in evaluating the integrity of electrical insulators and for electrostatic discharge (ESD) characterization.

Figure 6:
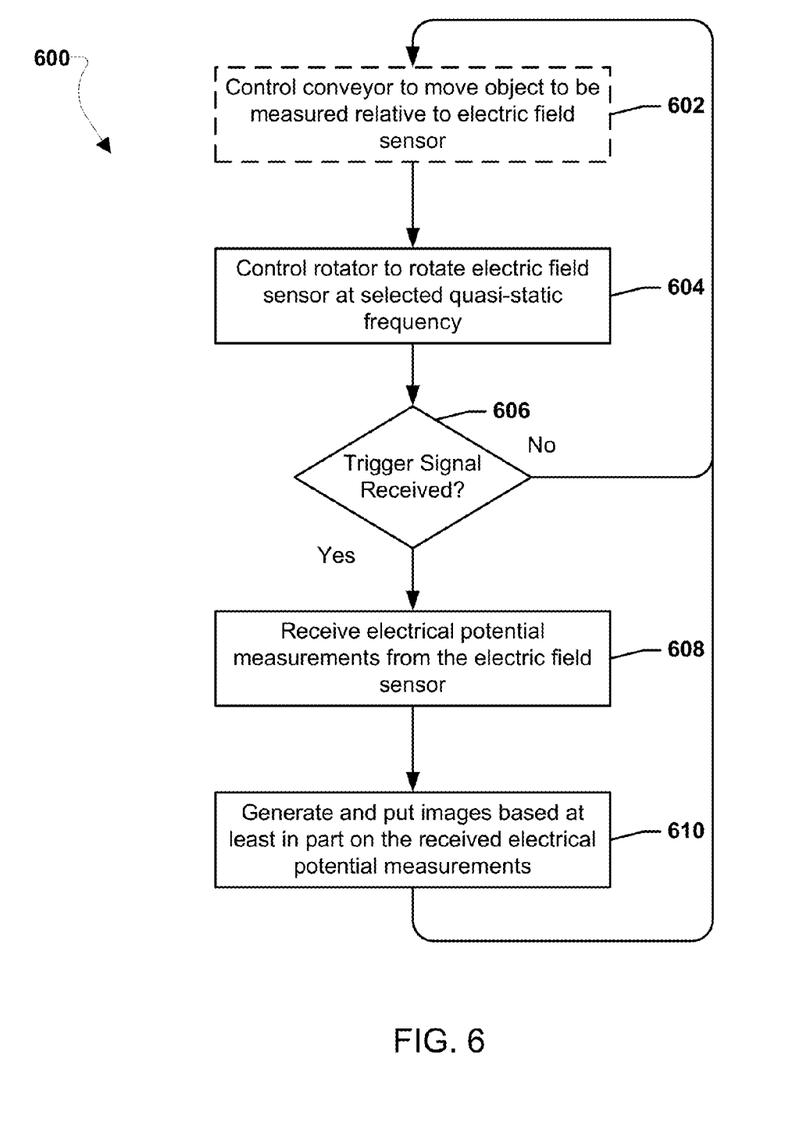
FIG. 6 is a process flow diagram illustrating an embodiment ephemeral electric potential and electric field measurement method.

FIG. 6 illustrates an embodiment ephemeral electric potential and electric field measurement method 600. In an embodiment, the operations of method 600 may be performed by the processor of a computing device, such as computing device 110 described above. In optional block 602 the processor may control the conveyor to move an object to be measured relative to an electric field sensor of an ephemeral electric potential and electric field sensor system. Block 602 may be optional because some objects may already be in motion and/or the ephemeral electric potential and electric field sensor system (and/or the electric field sensor of the ephemeral electric potential and electric field sensor system) may move relative to an object to be measured. Block 602 may also be optional because some objects may be fixed and an array of rotating ephemeral sensors may be utilized for imaging. For example, in a 2-D array of sensors embodiment, the object and the sensor array may both be fixed to produce images. In block 604 the processor may control a rotator to rotate the electric field sensor at a selected quasi-static frequency. As an example, the quasi-static frequency may be 2.4 Hz. In determination block 606 the processor may determine whether a trigger signal is received from a trigger control. Trigger signals may be received singularly, multiple times, and/or continuously during the rotation of the rotator. In response to determining a trigger signal is not received (i.e., determination block 606="No"), the method may return to block 602. In response to determination a trigger signal is received (i.e., determination block 606="Yes"), in block 608 the processor may receive electric potential measurements from the electric field sensor. For example, the processor may energize the sensor in response to the trigger signal, thereby receiving electric potential measurements from the electric field sensor. As another example, the processor may only record the measurement from the sensor in response to the trigger signal, thereby receiving electric potential measurements from the electric field sensor. In block 610 the processor may generate and output images based at least in part on the received electrical potential measurements. As an example, the processor may generate electrical potential images, electric field spatial vector component indications, electric field vector indications, and electric field magnitude indications based on the received electrical potential measurements and output these to a display. Upon generating and outputting the images, the method 600 may return to block 602.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

As discussed herein, a processor may be any programmable microprocessor, microcomputer or multiple processor chip or chips that can be configured by software instructions (applications) to perform a variety of functions, including the functions of the various embodiments described above. In some devices, multiple processors may be provided, such as one processor dedicated to wireless communication functions and one processor dedicated to running other applications. Typically, software applications may be stored in the internal memory before they are accessed and loaded into a processor. A processor may include internal memory sufficient to store the application software instructions. In many devices the internal memory may be a volatile or nonvolatile memory, such as flash memory, or a mixture of both. For the purposes of this description, a general reference to memory refers to memory accessible by a processor including internal memory or removable memory plugged into the device and memory within the processor itself.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc, are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more aspects, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein. The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc, are not intended to limit the order of the steps; these words are simply used to guide the reader through the description of the methods.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein, the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

All cited patents, patent applications and other references are incorporated herein by reference in their entirety. However, if a term in the present application contradicts or conflicts with a term in the incorporated reference, the term from the present application takes precedence over the conflicting term from the incorporated reference. All ranges disclosed herein are inclusive of the endpoints, and the endpoints are independently combinable with each other. Each range disclosed herein constitutes a disclosure of any point or sub-range lying within the disclosed range.

Reference throughout the specification to "another embodiment", "an embodiment", "exemplary embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

What is claimed is:

1. An ephemeral electric potential and electric field sensor system, comprising:
    at least one electric field sensor, wherein the electric field sensor is a field effect transistor ("FET") in a floating gate electronic configuration; and
    a rotator coupled to the electric field sensor and configured to rotate the electric field sensor at a quasi-static frequency.

2. The system of claim 1, further comprising:
    a display; and
    a processor connected to the display, the electric field sensor, and the rotator, wherein the processor is configured with processor executable instructions to perform operations comprising:
    controlling the rotator to rotate the electric field sensor at the quasi-static frequency;
    receiving electrical potential measurements from the electric field sensor while the electric field sensor is rotating at the quasi-static frequency;
    generating images based at least in part on the received electrical potential measurements; and
    outputting the images on the display.

3. The system of claim 2, wherein the images include one or more elements selected from the group consisting of electrical potential images, electric field spatial vector component indications, electric field vector indications, and electric field magnitude indications.

4. The system of claim 2, wherein the rotator is mounted to a support structure having brackets that are all triboelectrically neutral, low electric susceptibility, and non-conducting brackets.

5. The system of claim 2, wherein the rotator is further configured to rotate the electric field sensor in more than one axis of rotation.

6. The system of claim 5, wherein the electric field sensor is configured to move along at least one linear axis.

7. The systems of claim 6, wherein the processor is configured with processor executable instructions to perform operations such that receiving electrical potential measurements from the electric field sensor while the electric field sensor is rotating at the quasi-static frequency comprises receiving electrical potential measurements from the electric field sensor while the electric field sensor is rotating at the quasi-static frequency and moving along the linear axis.

8. The system of claim 2, further comprising:
    a conveyor configured to move an object to be measured relative to the electric field sensor.

9. The system of claim 2, further comprising a trigger control connected to the processor,
    wherein the processor is configured with processor executable instructions to perform operations further comprising receiving a trigger signal from the trigger control, and
    wherein the processor is configured with processor executable instructions to perform operations such that receiving electrical potential measurements from the electric field sensor while the electric field sensor is rotating at the quasi-static frequency comprises receiving electrical potential measurements from the electric field sensor while the electric field sensor is rotating at the quasi-static frequency based at least in part on the trigger signal.

10. The system of claim 9, wherein:
the rotator comprises:
a rotation stage; and
a shaft coupled to the rotation stage; and
the electric field sensor is mounted to the shaft.

11. The system of claim 10, wherein the electric field sensor is mounted to the shaft on the axis of rotation of the shaft or off the axis of rotation of the shaft.

12. The system of claim 1, wherein the electric field sensor is an array of electric field sensors.

13. An ephemeral electric potential and electric field measurement method, comprising:
rotating at least one electric field sensor at a quasi-static frequency, wherein the electric field sensor is a field effect transistor (FET) in a floating gate electronic configuration;
receiving, at a processor, electrical potential measurements from the electric field sensor while the electric field sensor is rotating at the quasi-static frequency;
generating, at the processor, images based at least in part on the received electrical potential measurements; and
outputting, from the processor, the images on a display.

14. The method of claim 13, wherein the images include one or more elements selected from the group consisting of electrical potential images, electric field spatial vector component indications, electric field vector indications, and electric field magnitude indications.

15. The method of claim 13, wherein rotating at least one electric field sensor at a quasi-static frequency comprises rotating at least one electric field sensor at a quasi-static frequency using a rotator mounted to a support structure having brackets that are all tribo-electrically neutral, low electric susceptibility, and non-conducting brackets.

16. The method of claim 13, wherein rotating at least one electric field sensor at a quasi-static frequency further comprises rotating the electric field sensor in more than one axis of rotation, the method further comprising moving the electric field sensor along at least one linear axis while receiving the electrical potential measurements from the electric field sensor.

17. The method of claim 13, further comprising moving an object to be measured relative to the electric field sensor while receiving the electrical potential measurements from the electric field sensor.

18. The method of claim 13, further comprising receiving, at the processor, a trigger signal from a trigger control, wherein receiving, at the processor, electrical potential measurements from the electric field sensor while the electric field sensor is rotating at the quasi-static frequency comprises receiving, at a processor, electrical potential measurements from the electric field sensor while the electric field sensor is rotating at the quasi-static frequency based at least in part on the trigger signal.

* * * * *